United States Patent
Mundt et al.

(10) Patent No.: US 10,168,750 B2
(45) Date of Patent: Jan. 1, 2019

(54) SYSTEMS AND METHODS FOR COOLING OF INFORMATION HANDLING RESOURCES

(71) Applicant: Dell Products L.P., Round Rock, TX (US)

(72) Inventors: Kevin W. Mundt, Austin, TX (US); Robert B. Curtis, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/293,841

(22) Filed: Oct. 14, 2016

(65) Prior Publication Data
US 2018/0107256 A1  Apr. 19, 2018

(51) Int. Cl.
*G06F 1/20* (2006.01)
*H05K 7/20* (2006.01)

(52) U.S. Cl.
CPC ......... *G06F 1/206* (2013.01); *H05K 7/20809* (2013.01); *H05K 7/20836* (2013.01)

(58) Field of Classification Search
CPC ............................ G06F 1/206; H05K 7/20318
USPC ................. 361/700; 165/104.33, 80.4, 80.5; 62/259.2, 515, 119; 257/E23.098, 715
See application file for complete search history.

(56) References Cited

U.S. PATENT DOCUMENTS

| | | | | |
|---|---|---|---|---|
| 8,650,896 B2 * | 2/2014 | Bean, Jr. | ................. | F25D 16/00 165/104.28 |
| 2005/0122684 A1 * | 6/2005 | Chu | ...................... | H05K 7/2079 361/698 |
| 2007/0151275 A1 * | 7/2007 | Chiriac | ................... | F25B 39/00 62/259.2 |
| 2007/0242438 A1 * | 10/2007 | Belits | .................. | F28D 15/0266 361/700 |
| 2008/0029248 A1 * | 2/2008 | Magnant | ................... | B01L 7/00 165/104.19 |
| 2011/0251728 A1 * | 10/2011 | Batho | ...................... | F04B 47/06 700/282 |
| 2012/0123595 A1 * | 5/2012 | Bower, III | ......... | G05D 23/1934 700/282 |
| 2013/0091867 A1 * | 4/2013 | Campbell | .......... | H05K 7/20809 62/3.2 |
| 2013/0091874 A1 * | 4/2013 | Sillato | ................ | H05K 7/20836 62/56 |
| 2014/0331080 A1 * | 11/2014 | Keith, Jr. | ............ | G06F 11/1662 714/4.11 |
| 2015/0032925 A1 * | 1/2015 | Chidester | ................ | G06F 13/36 710/110 |
| 2018/0231290 A1 * | 8/2018 | Pereira Zimmermann | ................. | F25B 49/02 |

\* cited by examiner

*Primary Examiner* — Mandeep S Buttar
(74) *Attorney, Agent, or Firm* — Jackson Walker L.L.P.

(57) ABSTRACT

In accordance with embodiments of the present disclosure, a system may include an information handling resource and an expansion cold plate thermally coupled to the information handling resource and configured to be fluidically coupled to a refrigeration system and configured to expand a refrigerant within the expansion cold plate in order to cool the information handling resource.

15 Claims, 2 Drawing Sheets

SYSTEMS AND METHODS FOR COOLING OF INFORMATION HANDLING RESOURCES

TECHNICAL FIELD

The present disclosure relates in general to information handling systems, and more particularly to cooling of information handling resources of an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the capabilities of information handling systems have improved, the power requirements of information handling systems and their component information handling resources have increased. Accordingly, the amount of heat produced by such information handling resources has increased. Because the electrical properties of information handling resources may be adversely affected by the presence of heat (e.g., some information handling resources may not operate correctly outside of a particular range of temperatures), information handling systems often include cooling systems configured to cool such information handling resources.

Traditionally, information handling resources have been cooled via the impingement of air driven by one or more fans. As the density of information handling resources present in information handling systems has increased, and as information handling resources have become faster (and thus hotter), the airflow required to provide adequate cooling has increased, leading to the need for more powerful fans and/or a greater numbers of fans. This leads to yet more power consumption, larger information handling system size, and excessive noise. In addition, because fans often transfer heat to those areas proximate to the information handling system being cooled, users of such information handling systems are often required to tolerate higher-than-typical temperatures.

As an improvement over traditional fan-based cooling systems, some information handling system manufacturers have provided mechanisms to cool individual component information handling resources with liquid, such as water. However, liquid circulation units and plumbing required to provide for liquid cooling may add significant complexity to a data center. In addition, many data center operators have a tremendous concern of introducing water into a data center, for the fear that a water leak may destroy components and data within the data center.

SUMMARY

In accordance with the teachings of the present disclosure, the disadvantages and problems associated with thermal management of information handling resources may be reduced or eliminated.

In accordance with embodiments of the present disclosure, a system may include an information handling resource and an expansion cold plate thermally coupled to the information handling resource and configured to be fluidically coupled to a refrigeration system and configured to expand a refrigerant within the expansion cold plate in order to cool the information handling resource.

In accordance with these and other embodiments of the present disclosure, a refrigeration system may include a condenser, a compressor, and a control unit. The condenser may be configured to condense a refrigerant from a gaseous state of the refrigerant to a liquid state of the refrigerant and configured to be fluidically coupled to a plurality of valves comprising at least a first valve fluidically interfaced between the refrigeration system and a first expansion cold plate thermally coupled to a first information handling resource of an information handling system and a second valve fluidically interfaced between the refrigeration system and a second expansion cold plate thermally coupled to a second information handling resource of the information handling system. The compressor may be configured to be fluidically coupled to a plurality of expansion cold plates comprising the first expansion cold plate and the second expansion cold plate, configured to be fluidically coupled to the condenser, and configured to drive the refrigerant through the plurality of valves, the plurality of expansion cold plates, and the condenser. The control unit may be communicatively coupled to the compressor and configured to control a speed for driving the refrigerant based on a plurality of refrigerant demand signals each indicative of an amount of a respective demand of refrigerant through each of the plurality of expansion cold plates.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
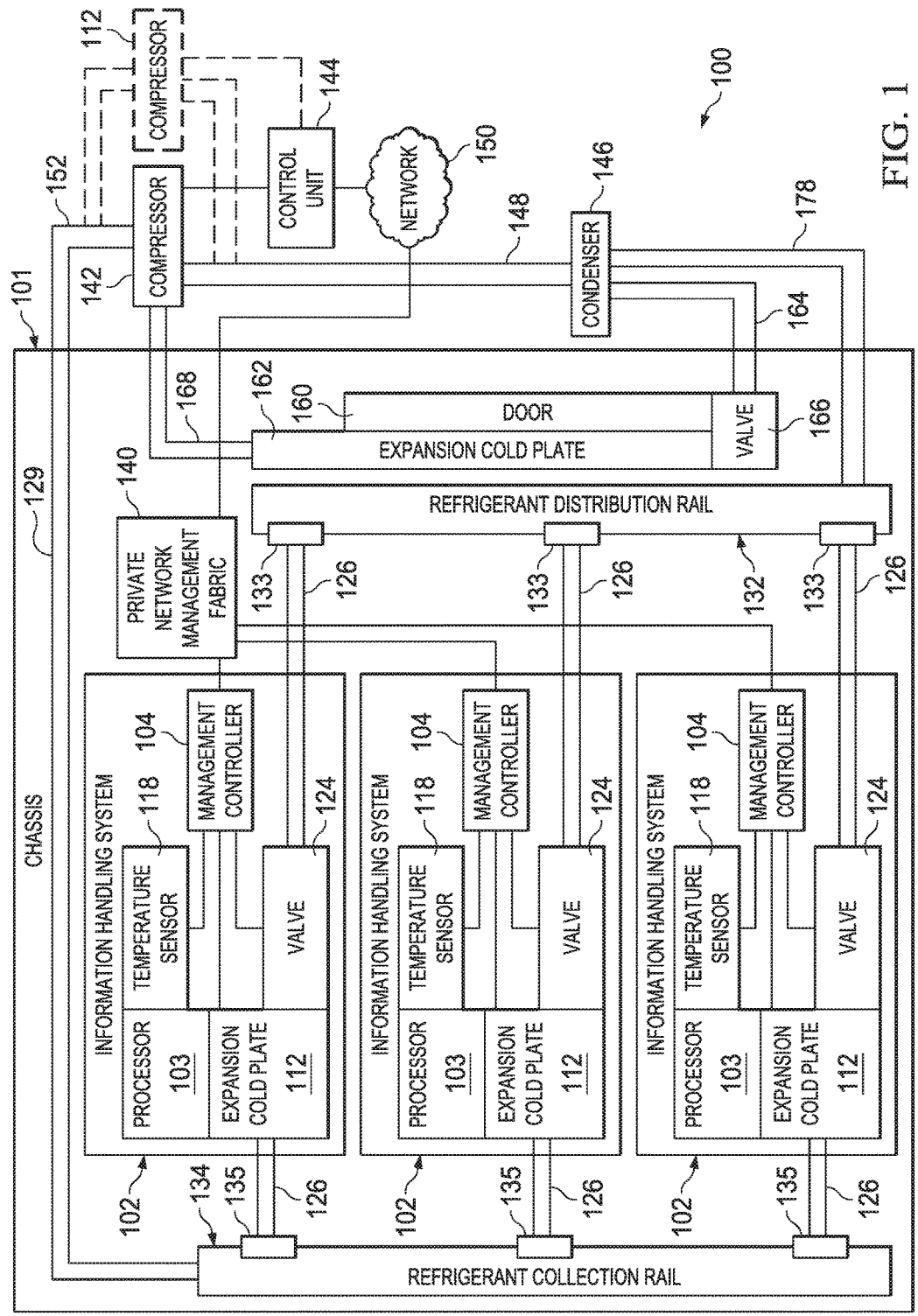
FIG. 1 illustrates a block diagram of an example system for cooling of information handling resources, in accordance with embodiments of the present disclosure.
Figure 2:
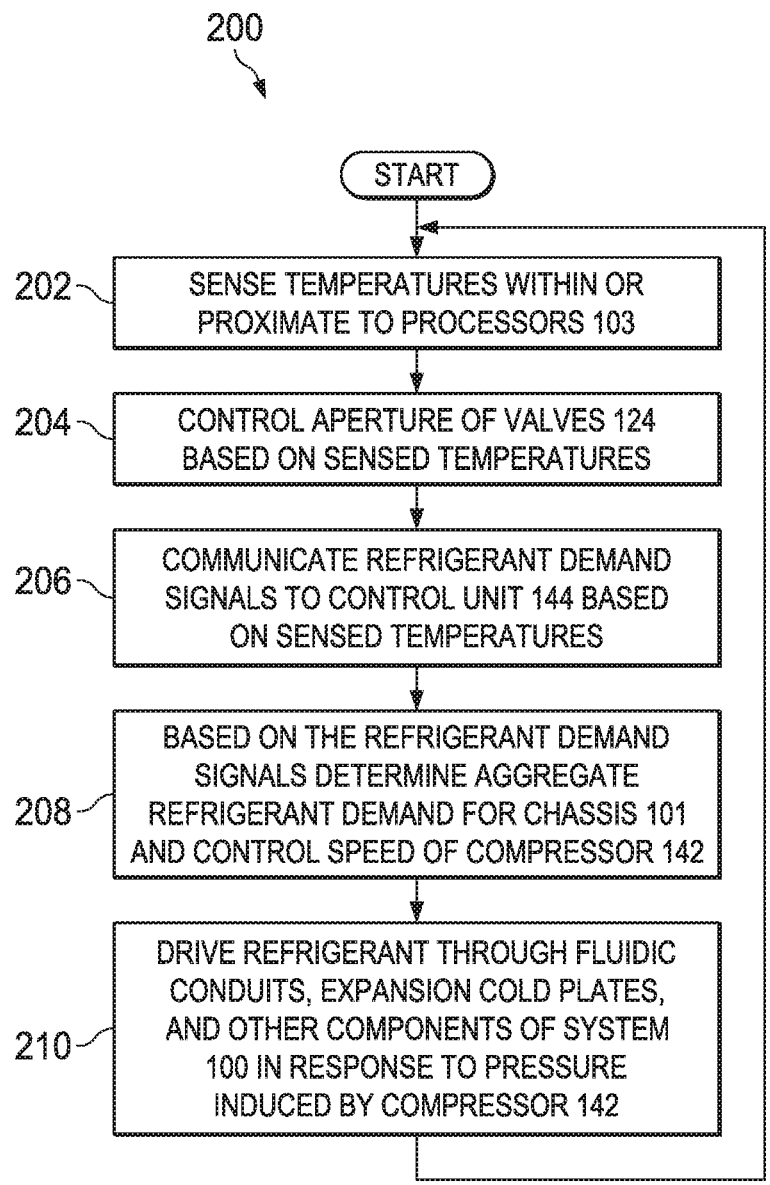
FIG. 2 illustrates a flow chart of an example method for cooling of information handling resources of a chassis, in accordance with embodiments of the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various I/O devices, such as a keyboard, a mouse, and a video display. The information handling system may also include one or more busses operable to transmit communication between the various hardware components.

For the purposes of this disclosure, information handling resources may broadly refer to any component system, device or apparatus of an information handling system, including without limitation processors, buses, memories, I/O devices and/or interfaces, storage resources, network interfaces, motherboards, electro-mechanical devices (e.g., fans), displays, and power supplies.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory ("RAM"), read-only memory ("ROM"), electrically erasable programmable read-only memory ("EEPROM"), and/or flash memory; as well as communications media such as wires, optical fibers, microwaves, radio waves, and other electromagnetic and/or optical carriers; and/or any combination of the foregoing.

For the purposes of this disclosure, a fluidic conduit may comprise any device, system or apparatus configured to contain and convey a fluid (e.g., compressed or expanded refrigerant), and may include, without limitation, a hose, tube, or pipe.

FIG. 1 illustrates a block diagram of an example system 100 for cooling of information handling resources, in accordance with embodiments of the present disclosure. As depicted in FIG. 1, system 100 may comprise a chassis 101 including a plurality of information handling systems 102, a network 150, and a refrigeration system comprising at least one compressor 142, a control unit 144, and a condenser 146.

As shown in FIG. 1, chassis 101 may, in addition to information handling systems 102, include a private network management fabric 140, a refrigerant distribution rail 132, a refrigerant collection rail 134, a door 160 mechanically coupled to the remainder of chassis 101, and an heat exchanger/expansion coil 162 mechanically and thermally coupled to door 160. In addition to these foregoing components, chassis 101 may include one or more other information handling resources.

An information handling system 102 may generally be operable to receive data from and/or communicate data to one or more information handling resources of chassis 101, including communicating with private management network fabric 140 via a management controller 104 integral to the information handling system 102. In certain embodiments, an information handling system 102 may be a server. In such embodiments, an information handling system may comprise a blade server having modular physical design. In these and other embodiments, an information handling system 102 may comprise a modular class server. As depicted in FIG. 1, an information handling system 102 may include a processor 103, a management controller 104, and a temperature sensor 118. In addition to processor 103, management controller 104, and temperature sensor 118, information handling system 102 may include one or more other information handling resources. In addition to information handling resources, an information handling system 102 may also include an expansion cold plate 112 mechanically and thermally coupled to processor 103 and a valve 124 fluidically coupled to expansion cold plate 112.

A processor 103 may include any system, device, or apparatus configured to interpret and/or execute program instructions and/or process data, and may include, without limitation, a microprocessor, microcontroller, digital signal processor ("DSP"), application specific integrated circuit ("ASIC"), or any other digital or analog circuitry configured to interpret and/or execute program instructions and/or process data. In some embodiments, processor 103 may interpret and/or execute program instructions and/or process data stored in a memory or other computer-readable media accessible to processor 103.

Information handling system 102 may include a management controller 104. Management controller 104 may be implemented by, for example, a microprocessor, microcontroller, DSP, ASIC, EEPROM, system on a chip (SoC), or any combination thereof. Management controller 104 may be configured to communicate with information handling resources internal or external to chassis 101 via private management network fabric 140. Management controller 104 may be configured to provide out-of-band management facilities for management of information handling system 102. Such management may be made by information handling resources of chassis 101 even if information handling system 102 is powered off or powered to a standby state. Management controller 104 may include a processor, memory, and network connection separate from the rest of information handling system 102. In certain embodiments, management controller 104 may include or may be an integral part of a baseboard management controller (BMC), Dell Remote Access Controller (DRAC) or an Integrated Dell Remote Access Controller (iDRAC).

Private management network fabric 140 may comprise a network and/or fabric configured to couple information handling systems 102 (e.g., via management controller 104) and one or more other information handling resources internal or external to chassis 101. In these and other embodiments, private management network fabric 140 may include a communication infrastructure, which provides physical connections, and a management layer, which organizes the physical connections and information handling resources communicatively coupled to private management network fabric 140. Private management network fabric 140 may be implemented as, or may be a part of, an Ethernet local area network (LAN) or any other appropriate architecture or system that facilitates the communication of signals, data, and/or messages.

Temperature sensor 118 may be any system, device, or apparatus (e.g., a thermocouple, thermistor, etc.) configured to communicate to management controller 104 or another controller indicative of a temperature within information handling system 102 (e.g., a temperature within or proximate to processor 103). In some embodiments, temperature sensor 118 may be external to processor 103 but either thermally coupled to processor 103 or sufficiently proximate to processor 103 in order to sense a temperature of processor 103. In other embodiments, temperature sensor 118 may be internal to processor 103.

Expansion cold plate 112 may be mechanically and thermally coupled to processor 103, such that heat generated by processor 103 and present on a surface of processor 103 may be transferred to expansion cold plate 112. Expansion cold plate 112 may be formed with metal or any other material generally conductive of heat, and may include one or more fluidic channels formed within such that as a refrigerant (e.g., a haloalkane refrigerant, often known by the trade name FREON) flows through expansion cold plate 112, all or a part of the refrigerant expands from liquid phase to gas phase, extracting heat from expansion cold plate 112 during such expansion, in turn cooling processor 103.

A valve 124 may include any device, system or apparatus that regulates, directs, and/or controls the flow of a refrigerant (e.g., a refrigerant flowing in a fluidic conduit 126) by opening, closing, or partially obstructing one or more passageways. When valve 124 is open, refrigerant may flow in a direction from higher pressure to lower pressure. The exposure to lower pressure (e.g., lower pressure within expansion cold plate 112 as opposed to higher pressure within fluidic conduit 126) may cause refrigerant to expand as it passes through valve 124 and expansion cold plate 112. As described in greater detail herein, the operation of a valve 124 (e.g., opening and closing, size of an aperture of valve 124) may be controlled by management controller 104, and thus, valve 124 may also include electromechanical components (e.g., a stepper motor or solenoid) communicatively coupled to management controller 104. As shown in FIG. 1, valve 124 may provide an interface between expansion cold plate 112 and a corresponding fluidic conduit 126.

As shown in FIG. 1, one or more fluidic conduits 126 may fluidically couple refrigerant distribution rail 132 (e.g., via corresponding fittings 133) to valves 124, and one or more fluidic conduits 126 may fluidically couple refrigerant collection rail 134 (e.g., via corresponding fittings 135) to expansion cold plates 112.

Refrigerant distribution rail 132 may comprise any device, system or apparatus configured to contain and convey a fluid (e.g., a pipe). In some embodiments, refrigerant distribution rail 132 may be mechanically mounted within chassis 101. As shown in FIG. 1, refrigerant distribution rail 132 may be fluidically coupled via a fluidic conduit 128 to a refrigeration system (e.g., to condenser 146), and may be coupled to one or more valves 124 via corresponding fluidic conduits 126. As also depicted in FIG. 1, refrigerant distribution rail 132 may include one or more fittings 133, each fitting 133 serving as an interface between refrigerant distribution rail 132 and a corresponding fluidic conduit 126. A fitting 133 may include any system, device, or apparatus for fluidically coupling a fluidic conduit to refrigerant distribution rail 132, including without limitation a quick connect fluid fitting.

Refrigerant collection rail 134 may comprise any device, system or apparatus configured to contain and convey a fluid (e.g., a pipe). In some embodiments, refrigerant collection rail 134 may be mechanically mounted within chassis 101. As shown in FIG. 1, refrigerant collection rail 134 may be fluidically coupled via a fluidic conduit 152 to a refrigeration system (e.g., to compressor 142), and may be coupled to one or more expansion cold plates 112 via corresponding fluidic conduits 126. As also depicted in FIG. 1, refrigerant collection rail 134 may include one or more fittings 135, each fitting 135 serving as an interface between refrigerant collection rail 134 and a corresponding fluidic conduit 126. A fitting 135 may include any system, device, or apparatus for fluidically coupling a fluidic conduit to refrigerant collection rail 134, including without limitation a quick connect fluid fitting.

When in use, whenever a user inserts a modular information handling system 102 into chassis 101, such user may also engage fittings 133 and 135 to the appropriate fluidic conduits 126, so as to create a fluidic path from refrigerant distribution rail 132 and refrigerant collection rail 134 via a valve 124 and an expansion cold plate 112 of such information handling system 102.

Door 160 may include any suitable structural member mechanically coupled to the remainder of chassis 101 via a hinge, sliding mechanism, or another suitable manner such that door 160 may be translated between an open position allowing access to the interior of chassis 101 from the exterior of chassis 101 and a closed position restricting access to the interior of chassis 101 from the exterior of chassis 101.

Heat exchanger/expansion coil 162 may be mechanically and thermally coupled to door 160, such that heat generated by information handling resources within chassis 101 and present in air internal to chassis 101 may be transferred to heat exchanger/expansion coil 162. Heat exchanger/expansion coil 162 may be formed with metal or any other material generally conductive of heat, and may include one or more fluidic channels formed within such that as a refrigerant (e.g., a haloalkane refrigerant, often known by the trade name FREON) flows through heat exchanger/expansion coil 162, all or a part of the refrigerant expands from liquid phase to gas phase, extracting heat from heat exchanger/expansion coil 162 during such expansion, in turn cooling air internal to chassis 101.

Heat exchanger/expansion coil 162 may be coupled to a refrigeration system (e.g., condenser 146) via valve 166 and fluidic conduit 164. Heat exchanger/expansion coil 162 may also be coupled to the refrigeration system (e.g., compressor 142) via another fluidic conduit 168.

Although not shown in FIG. 1, in some embodiments chassis 101 may include one or more air movers (e.g., fans or blowers) for driving a flow of air over heat exchanger/expansion coil 162, to further aid in cooling.

Valve 166 may include any device, system or apparatus that regulates, directs, and/or controls the flow of a refrigerant (e.g., a refrigerant flowing in fluidic conduit 164) by opening, closing, or partially obstructing one or more passageways. When valve 166 is open, refrigerant may flow in a direction from higher pressure to lower pressure. The exposure to lower pressure (e.g., lower pressure within heat exchanger/expansion coil 162 as opposed to higher pressure within fluidic conduit 164) may cause refrigerant to expand as it passes through valve 166 and heat exchanger/expansion coil 162.

Compressor 142 may comprise any suitable electromechanical device for increasing the pressure of refrigerant received from one or both of fluidic conduit 152 and fluidic conduit 168, thus reducing its volume. The pressure applied to the refrigerant may also drive the flow of refrigerant throughout the various fluidic conduits and expansion cold plates of system 100. After compressing refrigerant received from one or both of fluidic conduit 152 and fluidic conduit 168, compressor 142 may deliver the compressed refrigerant to condenser 146 via fluidic conduit 148.

Condenser 146 may comprise any suitable system, device, or apparatus for condensing refrigerant in a gaseous state to a liquid state, thus releasing heat from the refrigerant. In some embodiments, an air mover (e.g., fan or blower, not shown) may be used to cool condenser 146, allowing for greater cooling of the refrigerant. After the refrigerant is condensed in condenser 146, it may be conveyed to refrigerant distribution rail 132 via fluidic conduit 128 and/or to valve 166 via fluidic conduit 164.

Control unit 144 may comprise any system, device, or apparatus configured to receive an indication of a refrigerant demand by components of chassis 101 and control a speed of compressor 142 suitable to meet such demand. In some embodiments, control unit 144 may comprise a standalone information handling system. In other embodiments, control unit 144 may comprise a controller or microprocessor embedded within compressor 142. In yet other embodiments, control unit 144 may comprise a chassis management controller integral to chassis 101 and configured to facilitate management and/or control of component information handling resources of chassis 101. In such embodiments in which control unit 144 comprises a management controller integral to chassis 101, one or more of compressor 142 and condenser 146 may also be integral to chassis 101.

As shown in FIG. 1, control unit 144 may be communicatively coupled to private network management fabric 140 via a network 150. Network 150 may be a network and/or fabric configured to couple control unit 144 to private network management fabric 140. In these and other embodiments, network 150 may include a communication infrastructure, which provides physical connections, and a management layer, which organizes the physical connections and information handling systems communicatively coupled to network 150. Network 150 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or any other appropriate architecture or system that facilitates the communication of signals, data and/or messages (generally referred to as data). Network 150 may transmit data via wireless transmissions and/or wire-line transmissions using any storage and/or communication protocol, including without limitation, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or any other transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 150 and its various components may be implemented using hardware, software, or any combination thereof.

FIG. 2 illustrates a flow chart of an example method 200 for cooling of information handling resources of chassis 101, in accordance with embodiments of the present disclosure. According to some embodiments, method 200 may begin at step 202. As noted above, teachings of the present disclosure may be implemented in a variety of configurations of system 100. As such, the preferred initialization point for method 200 and the order of the steps comprising method 200 may depend on the implementation chosen.

At step 202, each temperature sensor 118 may sense a temperature within or proximate to an associated processor 103, and communicate a temperature signal indicative of such temperature to management controller 104. At step 204, in response, management controller 104 may control an aperture of a corresponding valve 124 to control a volumetric flow rate of refrigerant into an associated expansion cold plate 112 based on the temperature, thus creating a closed control loop for each processor 103/expansion cold plate 112 combination such that increases in a temperature associated with a processor 103 may increase the flow of refrigerant in the expansion cold plate 112 thermally coupled to the processor 103 (thus increasing the cooling of the processor 103) and such that decreases in a temperature associated with the processor 103 may decrease the flow of refrigerant in the expansion cold plate 112 thermally coupled to the processor 103 (thus decreasing the cooling of the processor 103), in order to keep the processor 103 operating within a desirable range of operating temperatures.

At step 206, having received the temperature signal, the management controller 104 may also communicate a refrigerant demand signal to control unit 144 (e.g., via private network management fabric 140 and network 150) indicative of an amount of refrigerant required to provide the desired level of cooling of the processor 103 associated with the management controller 104. Such refrigerant demand signal may be proportional to or otherwise correlated with the aperture of the valve 124 controlled by the management controller 104.

At step 208, based on the refrigerant demand signals received from management controllers 104 of the one or more information handling systems 102 disposed in chassis 101, control unit 144 may determine an aggregate refrigerant demand for chassis 101, and control a speed of a variable-speed compressor 142 in order to deliver refrigerant to chassis 101 in accordance with such aggregate refrigerant demand. In some embodiments, control unit 144 may also include a temperature sensor and/or other ambient sensors, and control unit 144 may also control the speed of compressor 142 in order to ensure that temperature of the refrigerant remains above an ambient dewpoint, so as to avoid condensation of water exterior to the various fluidic conduits and expansion cold plates of system 100.

Thus, at step 210, compressor 142 will generate pressure in accordance with a speed set by control unit 144 in order to pull refrigerant from refrigerant collection rail 134 and drive such refrigerant to condenser 146, such that refrigerant flows through refrigerant distribution rail 132 and through expansion cold plates 112 based on individual valve control settings of the various valves 124 interfaced with the expansion cold plates 112. Refrigerant may expand while in each expansion cold plate from liquid to gaseous state, providing cooling to an associated processor 103, after which fluid pressure further drives refrigerant from the individual expansion cold plates 112 to refrigerant collection rail 134, where the cycle of refrigerant flow described in this paragraph may repeat.

After completion of step 210, method 200 may proceed again to step 202.

Although FIG. 2 discloses a particular number of steps to be taken with respect to method 200, method 200 may be executed with greater or lesser steps than those depicted in FIG. 2. In addition, although FIG. 2 discloses a certain order of steps to be taken with respect to method 200, the steps comprising method 200 may be completed in any suitable order.

Method 200 may be implemented using system 100, and/or any other system operable to implement method 200. In certain embodiments, method 200 may be implemented partially or fully in software and/or firmware embodied in computer-readable media.

Similar to the flow of refrigerant described above with respect to method 200, compressor 142 may also drive the flow of refrigerant in a loop including valve 166 and heat exchanger/expansion coil 162, so as to provide cooling of air within chassis 101 such that information handling resources other than processors 103 may be cooled by the air cooled by expansion of refrigerant in heat exchanger/expansion coil 162. Although not shown in FIG. 1, in some embodiments, heat exchanger/expansion coil 162 may also have a temperature sensor and control mechanism associated with it providing feedback control for valve 166. Also, although FIG. 1 depicts heat exchanger/expansion coil 162 coupled to a door 160 of chassis 101, heat exchanger/expansion coil 162 may be mechanically coupled to any other suitable structural component of chassis 101.

In addition, as indicated by the dashed lines in FIG. 1, in some embodiments of system 100, system 100 may comprise more than one compressor 142. In such embodiments, such additional compressor(s) 142 may be used for redundancy, in case of failure of a compressor 142, and/or used for load sharing, as to reduce wear and tear of individual compressors 142, potentially extending the useful lives of compressors 142. In such embodiments, control unit 144 may control the redundant operation and/or load sharing among compressors 142.

Although FIG. 1 depicts each information handling system 102 having a single processor 103 and expansion cold plate 112, embodiments may exist in which each information handling system 102 has multiple processors 103 and/or multiple expansion cold plates 112.

Although FIG. 1 depicts system 100 having a single chassis 101, embodiments may exist in which system 100 has multiple chassis 101, each one fluidically coupled to the refrigeration system comprising compressor 142, control unit 144, and condenser 146.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:
   an information handling system including an information handling resource;
   a management controller configured to provide out-of-band management of the information handling system; and
   an expansion cold plate thermally coupled to the information handling resource and configured to be fluidically coupled to a refrigeration system that includes a compressor and a second compressor configured to compress a refrigerant and a condenser configured to condense the refrigerant from a gaseous state to a liquid state;
   wherein the management controller is configured to determine a refrigerant demand for the information handling resource to cool the expansion cold plate to a plate temperature that is below an ambient temperature within the system and above a dew point for the system;
   wherein the refrigeration system is further configured to receive control signals from the management controller operable to cause the refrigeration system to distribute the refrigerant based on the determined refrigerant demand and expand the refrigerant within the expansion cold plate to cool the information handling resource by converting the refrigerant from the liquid state to the gaseous state to cool the expansion cold plate to the plate temperature that is below an ambient temperature within the system and above the dew point for the system; and
   wherein the management controller is further configured to control the compressor and the second compressor to load share between the compressor and the second compressor.

2. The system of claim 1, wherein the information handling resource comprises a processor.

3. The system of claim 1, further comprising a valve configured to be fluidically coupled between the expansion cold plate and the refrigeration system, and configured to deliver a volumetric flow rate of refrigerant through the valve based on a temperature associated with the information handling resource.

4. The system of claim 3, wherein the management controller is communicatively coupled to the valve and configured to receive a temperature signal indicative of the temperature and control the volumetric flow rate based on the temperature.

5. The system of claim 4, wherein the management controller is further configured to communicate a refrigerant demand signal indicative of the refrigerant demand and based on the volumetric flow rate.

6. The system of claim 5, further comprising:
a second information handling resource;
a second expansion cold plate thermally coupled to the second information handling resource and configured to be fluidically coupled to the refrigeration system and configured to expand the refrigerant within the second expansion cold plate in order to cool the second information handling resource; and
a second valve configured to be fluidically coupled between the second expansion cold plate and the refrigeration system, and configured to deliver a second volumetric flow rate of refrigerant through the second valve based on a second temperature associated with the second information handling resource;
wherein the management controller is communicatively coupled to the second valve and configured to receive a second temperature signal indicative of the second temperature and control the second volumetric flow rate based on the second temperature and configured to communicate a second refrigerant demand signal based on the second volumetric flow rate.

7. The system of claim 6, wherein the refrigeration system is configured to drive the refrigerant to the expansion cold plate and the second expansion cold plate based on an aggregate refrigerant demand based on the refrigerant demand signal and the second refrigerant demand signal.

8. The system of claim 6, further comprising:
a refrigerant distribution rail fluidically coupled between the refrigeration system and each of the valve and the second valve; and
a refrigerant collection rail fluidically coupled between the refrigeration system and each of the expansion cold plate and the second expansion cold plate.

9. The system of claim 8, wherein the refrigeration system is configured to drive the refrigerant to the refrigerant distribution rail and from refrigerant collection rail based on an aggregate refrigerant demand based on the refrigerant demand signal and the second refrigerant demand signal.

10. The system of claim 4, further comprising a temperature sensor configured to sense the temperature and communicate the temperature signal to the management controller.

11. The system of claim 1, further comprising:
a second information handling resource;
a chassis for enclosing the information handling resource and the second information handling resource; and
a second expansion cold plate configured to be fluidically coupled to the refrigeration system and configured to expand a refrigerant within the second expansion cold plate to cool the second information handling resource by cooling air internal to the chassis, wherein the second expansion cold plate is not coupled directly to any information handling resource of the system.

12. A refrigeration system comprising:
a management controller configured to provide out-of-band management of an information handling system;
a condenser configured to condense a refrigerant from a gaseous state of the refrigerant to a liquid state of the refrigerant and configured to be fluidically coupled to a plurality of valves comprising at least:
a first valve fluidically interfaced between the refrigeration system and a first expansion cold plate thermally coupled to a first information handling resource of the information handling system; and
a second valve fluidically interfaced between the refrigeration system and a second expansion cold plate thermally coupled to a second information handling resource of the information handling system;
a compressor configured to be fluidically coupled to a plurality of expansion cold plates comprising the first expansion cold plate and the second expansion cold plate, configured to be fluidically coupled to the condenser, and configured to drive the refrigerant through the plurality of valves, the plurality of expansion cold plates, and the condenser;
a second compressor configured to be fluidically coupled to the condenser and to the plurality of expansion cold plates, and further configured to drive the refrigerant through the plurality of valves, the plurality of expansion cold plates, and the condenser; and
a control unit communicatively coupled to the management controller and the compressor and configured to control a speed for driving the refrigerant based on a plurality of refrigerant demand signals received from the management controller, each refrigerant demand signal being indicative of an amount of a respective demand of refrigerant through each of the plurality of expansion cold plates and configured to cool the first and second expansion cold plates to plate temperatures below an ambient temperature within the information handling system and above a dew point for the information handling system, the control unit being further configured to control the compressor and the second compressor to load share between the compressor and the second compressor;
wherein the refrigeration system is configured to cool the first and second expansion cold plates to the plate temperatures below the ambient temperature within the information handling system and above the dew point for the information handling system by converting the refrigerant from the liquid state to the gaseous state inside the first expansion cold plate.

13. The refrigeration system of claim 12, wherein each of the plurality of refrigerant demand signals is based on a respective temperature associated each of a plurality of information handling resources comprising the first information handling resource and the second information handling resource.

14. The refrigeration system of claim 12, wherein the first information handling resource and the second information handling resource each comprise processors.

15. The refrigeration system of claim 12, wherein the control unit is further configured to control the compressor and the second compressor to provide redundancy to the compressor.

* * * * *